(12) United States Patent
Su

(10) Patent No.: US 7,532,471 B2
(45) Date of Patent: May 12, 2009

(54) FAN FASTENING STRUCTURE FOR COMPUTER HOUSING

(75) Inventor: Yen-Wen Su, Taoyuan (TW)

(73) Assignee: Enermax Technology Corporation, Taoyuan (TW)

( * ) Notice: Subject to any disclaimer, the term of this patent is extended or adjusted under 35 U.S.C. 154(b) by 0 days.

(21) Appl. No.: 11/797,104

(22) Filed: May 1, 2007

(65) Prior Publication Data

US 2008/0273304 A1 Nov. 6, 2008

(51) Int. Cl.
*H05K 7/20* (2006.01)
(52) U.S. Cl. .................... 361/695; 361/694; 454/184
(58) Field of Classification Search ............ 361/687, 361/694, 695; 454/184
See application file for complete search history.

(56) References Cited

U.S. PATENT DOCUMENTS

| | | | | |
|---|---|---|---|---|
| 4,327,398 A * | 4/1982 | Christison | .................. | 361/695 |
| 4,517,880 A * | 5/1985 | Buckner et al. | ............ | 454/184 |
| 5,481,433 A * | 1/1996 | Carter | ........................ | 361/690 |
| 6,404,630 B1 * | 6/2002 | Lai | ........................... | 361/697 |
| 6,570,760 B1 * | 5/2003 | Wang | ......................... | 361/687 |
| 6,702,661 B1 * | 3/2004 | Clifton et al. | ............... | 454/184 |
| 6,791,837 B2 * | 9/2004 | Chen et al. | ................... | 361/695 |
| 6,920,044 B2 * | 7/2005 | Lin | ............................ | 361/697 |
| 6,987,669 B2 * | 1/2006 | Chen | ........................... | 361/695 |
| 2004/0004814 A1 * | 1/2004 | Chen | ........................... | 361/694 |
| 2004/0100768 A1 * | 5/2004 | Chen et al. | ................... | 361/697 |
| 2005/0052846 A1 * | 3/2005 | Lin et al. | ..................... | 361/695 |
| 2005/0274498 A1 * | 12/2005 | Li et al. | ...................... | 165/121 |
| 2006/0002084 A1 * | 1/2006 | Wei | ............................ | 361/695 |

* cited by examiner

*Primary Examiner*—Gregory D Thompson
(74) *Attorney, Agent, or Firm*—Rosenberg, Klein & Lee

(57) ABSTRACT

A fan fastening structure for a computer housing includes a computer housing, an air-guiding mask, and a cooling fan. The computer housing has a front board and a backboard. An opening is located outside of the backboard that links into the interior of the computer housing. One front end of the air-guiding mask is located at the opening of the backboard, and the rear end is installed with the cooling fan. One front end of the air-guiding mask forms an air inlet, and the rear end forms an air outlet. There is a channel that links the air inlet with the air outlet. The cooling fan has an air-entering surface and an air-exhausting surface. The air-entering surface corresponds to the air outlet. By cooperating with the air-guiding mask and the cooling fan, heat is exhausted to the outside of the computer housing quietly, rapidly, and efficiently. Costs are thereby reduced.

5 Claims, 3 Drawing Sheets

FAN FASTENING STRUCTURE FOR COMPUTER HOUSING

BACKGROUND OF THE INVENTION

1. Field of the Invention

The present invention relates to a fan fastening structure for a computer housing. In particular, this invention relates to a fan fastening structure that can rapidly and efficiently exhaust heat in a computer housing to the outside of the computer housing.

2. Description of the Related Art

Inside a computer housing there are a number of circuit boards and electronic components. When the computer is running, heat is generated from the electronic components in the computer housing, such as the chips, the ICs etc, and the temperature rises. If the temperature in the computer housing exceeds the operational specifications of the electronic components, the electronic components will fail and the computer will shut down. Therefore, a cooling fan is usually installed in the computer housing to exhaust the heat generated from the electronic components to the outside of the computer housing.

Reference is made to FIG. 1, which shows a fan fastening structure of the prior art. The fan fastening structure includes a computer housing 10a, a power supply 20a, and a plurality of small cooling fans 30a. There is a backboard 11a on the rear side of the computer housing 10a. The power supply 20a is located on the inner side of the backboard 11a and is adjacent to the top of the backboard 11a. The cooling fans 30a are screwed on the inner side of the backboard 11a by screws 40a, and are located below the power supply 20a. Heat generated in the computer housing 10a is exhausted to the outside of the computer housing 10 via the cooling fans 30a.

However, because the space of the backboard 11a of the computer housing 10a is limited, the plurality of small cooling fans 30a is merely installed on the available space of the backboard 11a. Because the exhausting capacity of the cooling fan 30a is small, the cooling fans must be operated at high speed to exhaust the heat. Therefore, it is noisy, and the cost of the plurality of small cooling fans 30a is high.

SUMMARY OF THE INVENTION

One particular aspect of the present invention is to provide a fan fastening structure for a computer housing. There is only one big cooling fan installed on the rear side of the computer housing. The cooling fan is attached on an outside of the backboard of the computer housing via an air-guiding mask. By cooperating with the air-guiding mask and the cooling fan, heat is exhausted to the outside of the computer housing quietly, rapidly, and efficiently. The cost is reduced.

The fan fastening structure for a computer housing includes a computer housing having a front board and a backboard that is opposite to the front board, an air-guiding mask, and a cooling fan. An opening is located outside of the backboard that links into the interior of the computer housing. One end of the air-guiding mask is located at the opening of the backboard, and forms an air inlet that corresponds to the opening. A second end of the air-guiding mask forms an air outlet. There is a channel in the interior of the air-guiding mask that links the air inlet with the air outlet. The cooling fan is installed at a second end of the air-guiding mask. The cooling fan has an air-entering surface and an air-exhausting surface that is opposite to the air-entering surface. The air-entering surface corresponds to the air outlet of the air-guiding mask.

The present invention has the following characteristics. The present invention installs a big cooling fan at the backboard of the computer housing, and uses the air-guiding mask to guide heat in the computer housing to the cooling fan. Thereby, the cooling fan can be operated at a low speed to exhaust heat to the outside of the computer housing efficiently. It is quiet and the cost is reduced.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
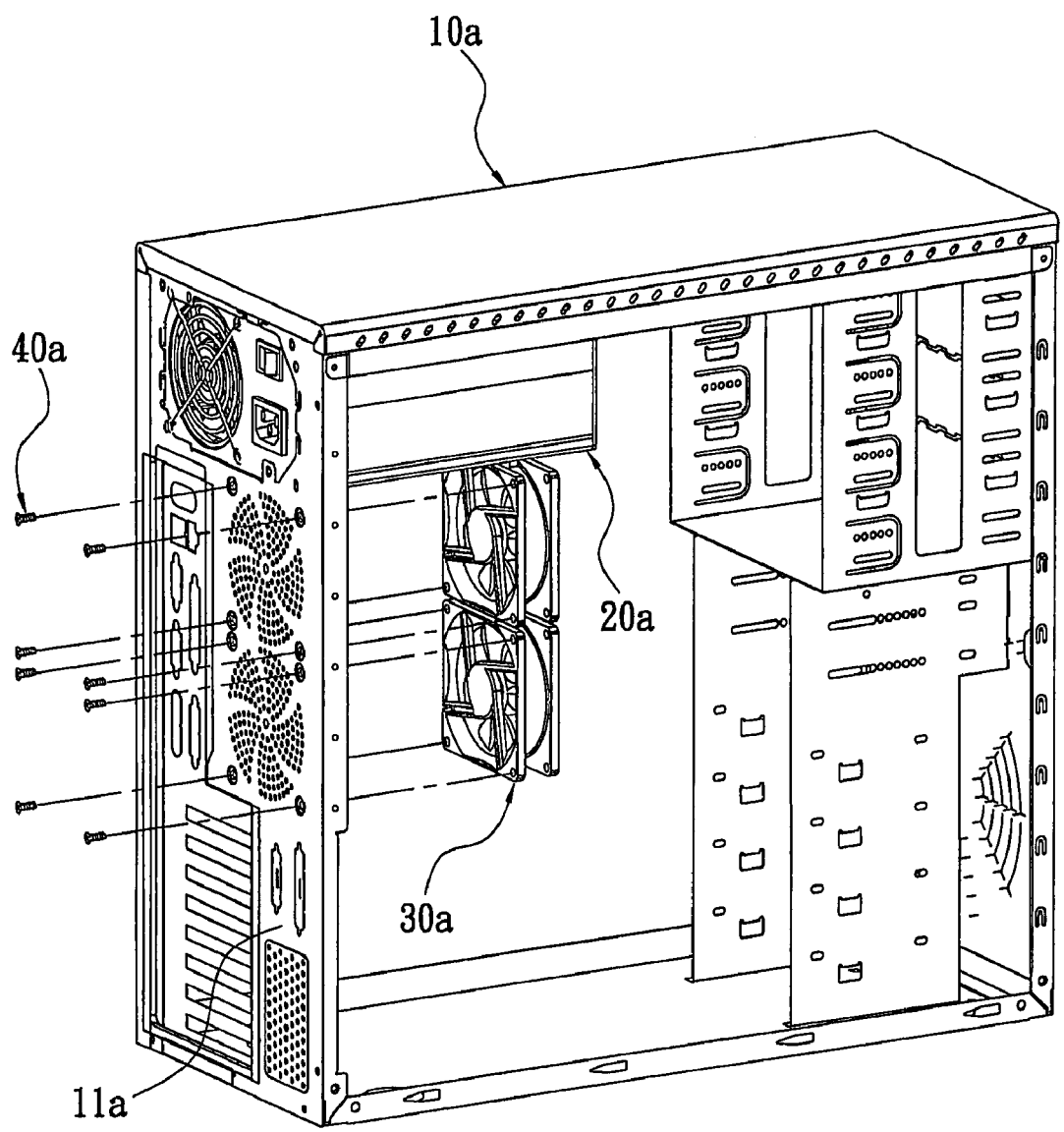
FIG. 1 is an exploded perspective view of a fan fastening structure of the prior art.
Figure 2:
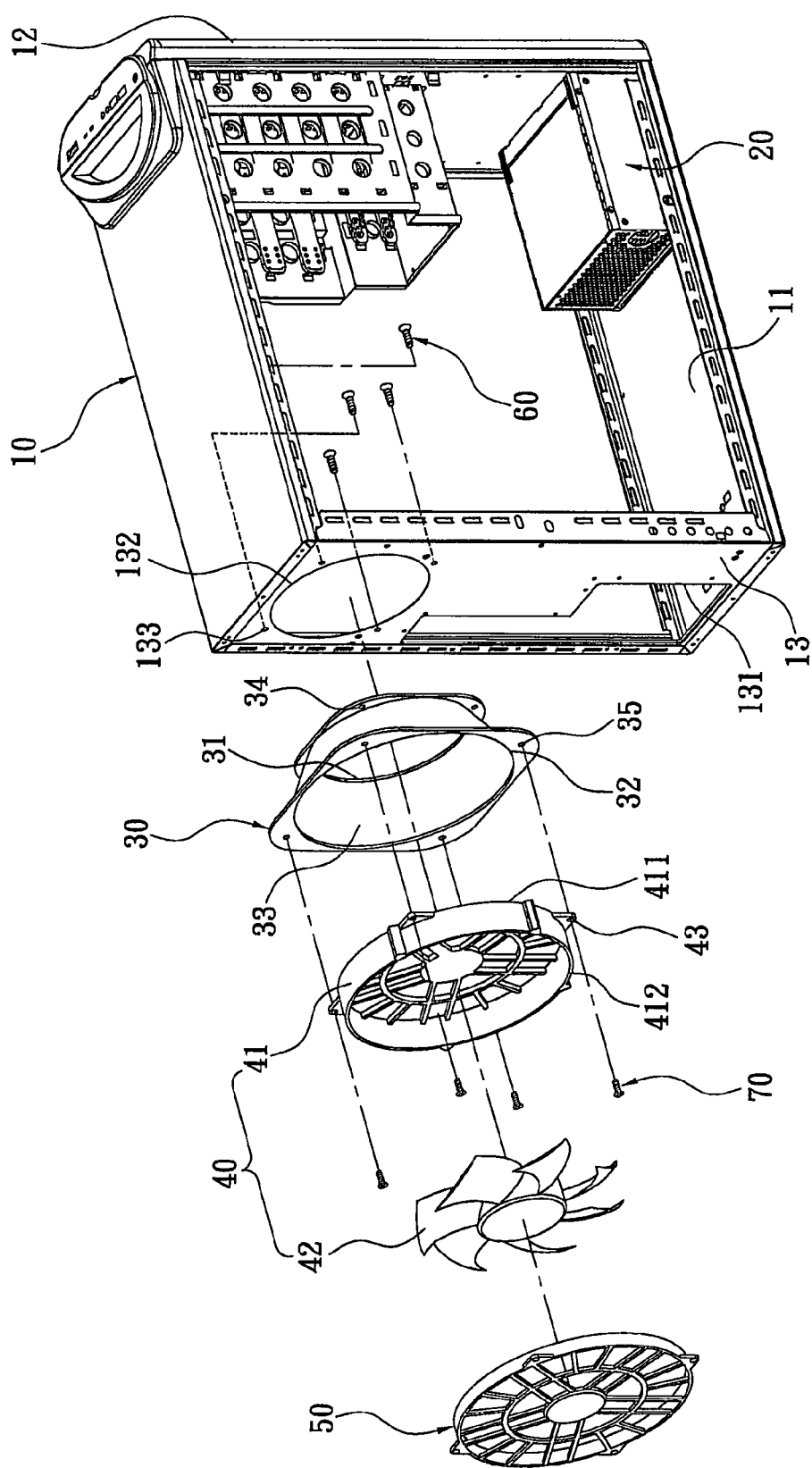
FIG. 2 is an exploded perspective view of the present invention.
Figure 3:
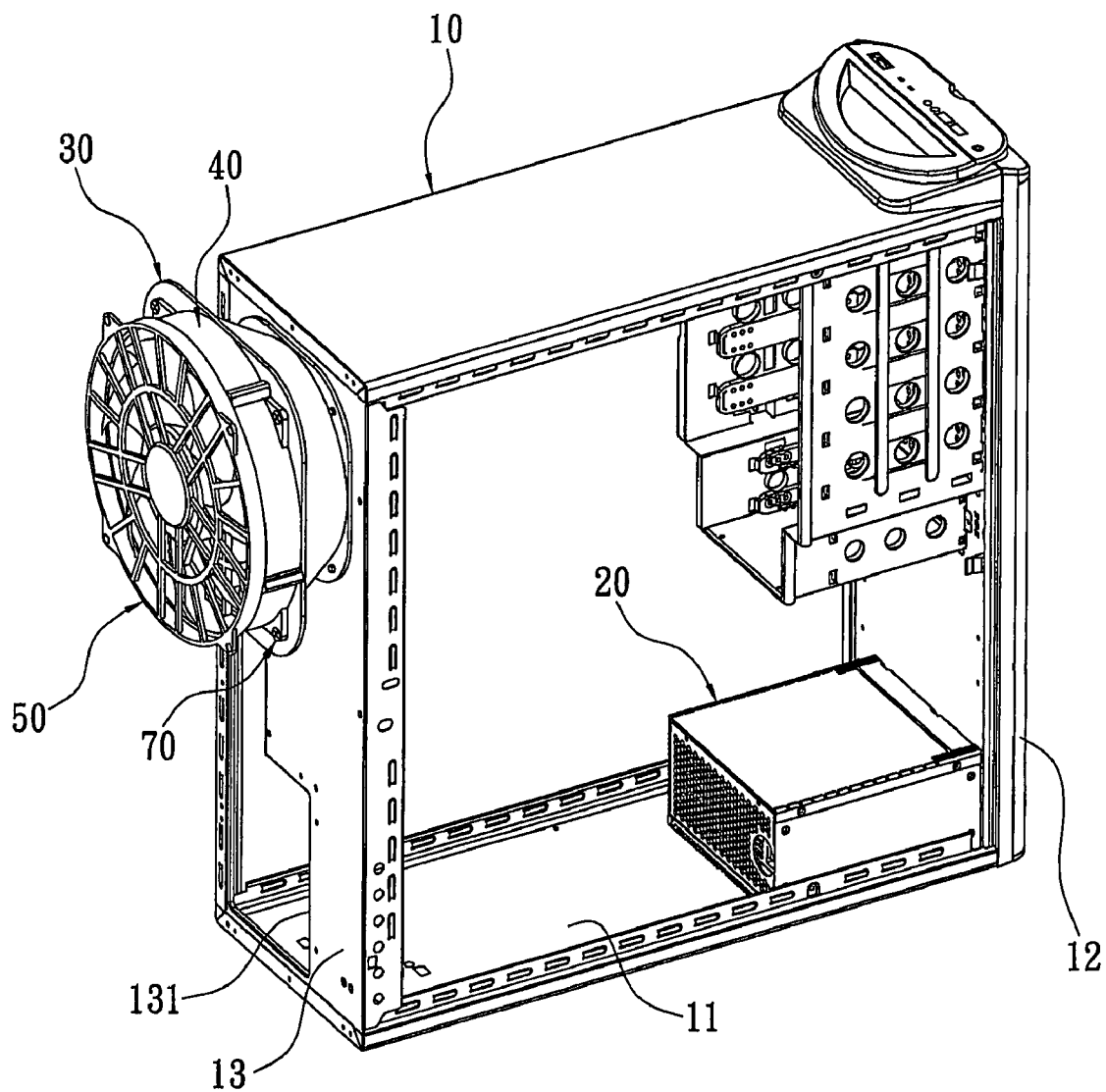
FIG. 3 is an assembly perspective view of the present invention.

Reference is made to FIGS. 2 and 3. The fan fastening structure for a computer housing includes a computer housing 10, a power supply 20, an air-guiding mask 30, and a cooling fan 40.

The computer housing 10 is a hollow box. In the interior of the computer housing 10, there is a receiving space 11 for receiving circuit boards and electronic components (not shown in the figure).

On the front side of the computer housing 10, there is a front board 12. On the rear side of the computer housing 10, there is a backboard 13. The backboard 13 is opposite to the front board 12. There is a through hole 131 on the backboard 13. The through hole 131 can be installed with a blocking board (not shown in the figure) that has a hole (not shown in the figure) that can be plugged by the connector of the circuit board. A circular opening 132 is on the outside of the backboard 13. The opening 132 is located on the backboard 13, and is close to the top of the computer housing 10 (above the through hole 131) and links with the interior of the computer housing 10. There a plurality of through holes 133 located on the backboard 13 and close to the surrounding edge of the opening 132.

The power supply 20 is installed in the interior of the receiving space 11 of the computer housing 10, and is located at the bottom of the receiving space 11, close to the inner side of the front board 12. The power supply is connected with a power inlet to provide the required power to the computer.

The air-guiding mask 30 is a hollow mask. The front side surface of the air-guiding mask 30 forms an air inlet 31. The air inlet 31 corresponds to the opening 132 of the backboard 13. The rear side surface of the air-guiding mask 30 forms an air outlet 32 whose diameter is larger than the diameter of the air inlet 31. There is a channel 33 in the interior of the air-guiding mask 30 that links the air inlet 31 with the air outlet 32. The diameter of the channel 33 becomes larger and larger as it progresses from the air inlet 31 to the air outlet 32 to match the cooling fan 40.

The front side surface of the air-guiding mask 30 has a first fastening hole 34 that corresponds to the through hole 133 of the backboard 13. The rear side surface of the air-guiding mask 30 has a plurality of second fastening holes 35.

The cooling fan 40 is a fan having a bigger frame 41 and bigger fan leaves 42. The frame 41 has an air-entering surface 411 and an air-exhausting surface 412. The air-entering surface 411 corresponds to the air outlet 32 of the air-guiding mask 30. The air-exhausting surface 412 is located opposite to the air-entering surface 411. There is a plurality of holes 43 at the surrounding edge of the frame 41. The holes 43 correspond to the second fastening holes 35.

The fan leaves are pivoted on the frame 41. The diameter of the fan leaves 42 can be larger than 16 cm. Alternatively, the diameter of the fan leaves 42 can be larger than the width of the computer housing 10.

The cooling fan 40 is further installed with a protective screen 50 or a filtering screen (not shown in the figure) on the air-exhausting surface 412 to protect the fan leaves 42.

When the air-guiding mask 30 is assembled, the screw 60 passes through the through hole 133 of the backboard 13 and is screwed into the first fastening hole 34 of the air-guiding mask 30. Thereby, the front end of the air-guiding mask 30 is screwed onto the opening 132 of the backboard 13 so that the air inlet 31 links with the air outlet 32.

The screw 70 passes through the hole 43 of the cooling fan 40 and is screwed into the second fastening hole 35 of the air-guiding mask 30. Thereby, the cooling fan 40 is screwed on the rear side of the air-guiding mask 30 so that the air-entering surface 411 of the cooling fan 40 corresponds to and pastes onto the air outlet 32 of the air-guiding mask 30. In this embodiment, screws are used for connecting the backboard 13, the air-guiding mask 30, and the cooling fan 40. However, it is not limited to the description above.

Heat in the computer housing 10 passes through the opening 132 of the backboard 13 and the air inlet 31 of the air-guiding mask 30, and enters into the channel 33. Then, the heat is rapidly and efficiently exhausted to the outside of the computer housing 10 by the cooling fan 40 located at the air outlet 32 of the air-guiding mask 30.

The present invention can install a bigger cooling fan 40 on the outside of the backboard 13 by adding an air-guiding mask 30. The diameter of the fan leaves 42 of the cooling fan 40 can be larger than the width of the computer housing 10. By adding the air-guiding mask 30, heat in the computer housing 10 can pass through the opening 132 of the backboard 13 and is guided into the channel 33. Then, by utilizing the larger air-exhausting capacity of the big cooling fan 40, heat can be rapidly and efficiently exhausted to the outside from the rear side of the computer housing 10. The cooling fan 40 can be operated at a low speed to exhaust the air, however the quantity of air being exhausted is the same as a plurality of small cooling fans. Thereby, noise is lowered, and the cost is reduced due to only one cooling fan being used.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A fan fastening structure for a computer housing having a front board, a backboard that is opposite to the front board, and an opening in the backboard communicating with an interior of the computer housing, wherein the fan fastening structure comprises:

an air-guiding mask installed externally on said computer housing, wherein one end of the air-guiding mask is mounted on the opening of the backboard and forms an air inlet that corresponds to the opening, a second end of the air-guiding mask forms an air outlet, and there is a channel in the interior of the air-guiding mask that communicates the air inlet with the air outlet; and a cooling fan installed at the second end of the air-guiding mask, wherein the cooling fan has an air-entering surface and an air-exhausting surface that is opposite to the air-entering surface, and the air-entering surface corresponds to the air outlet of the air-guiding mask, wherein the cooling fan has a fan leaf, said fan leaf having a diameter larger than the width of said computer housing.

2. The fan fastening structure for a computer housing as claimed in claim 1, wherein the interior of the computer housing has a power supply, and the power supply is close to an inner side of the front board.

3. The fan fastening structure for a computer housing as claimed in claim 1, wherein the opening is located on the backboard and is close to a top of the computer housing.

4. The fan fastening structure for a computer housing as claimed in claim 1, wherein a diameter of the channel becomes larger and larger from the air inlet to the air outlet.

5. The fan fastening structure for a computer housing as claimed in claim 1, wherein the diameter of the fan leaf is larger than 16 cm.

* * * * *